United States Patent [19]

Clark et al.

[11] Patent Number: 5,157,528
[45] Date of Patent: Oct. 20, 1992

[54] DEVICES AND PROCESS FOR PRODUCING MICROFILM AND MICROFICHE RECORDS

[75] Inventors: Michael G. Clark, Gerrards Cross; Ciaran B. McArdle, Dublin, both of England

[73] Assignee: The General Electric Company, p.l.c.

[21] Appl. No.: 368,366

[22] PCT Filed: Oct. 5, 1988

[86] PCT No.: PCT/GB88/00819

§ 371 Date: Jun. 21, 1989

§ 102(e) Date: Jun. 21, 1989

[87] PCT Pub. No.: WO89/03578

PCT Pub. Date: Apr. 20, 1989

[30] Foreign Application Priority Data

Oct. 6, 1987 [GB] United Kingdom ............ 8723394

[51] Int. Cl.⁵ .................................................. G02F 1/13
[52] U.S. Cl. .................................. 359/72; 359/43; 359/44
[58] Field of Search .............. 350/342, 352; 359/43, 359/44, 45, 48, 72; 358/236

[56] References Cited

U.S. PATENT DOCUMENTS

| | | | |
|---|---|---|---|
| 3,723,651 | 3/1973 | Gorog | 350/342 |
| 3,764,211 | 10/1973 | Morse et al. | 350/342 |
| 4,440,473 | 4/1984 | Sekimoto | 350/342 |
| 4,643,533 | 2/1987 | Armitage | 350/350 S |

FOREIGN PATENT DOCUMENTS

| | | |
|---|---|---|
| 0012651 | 6/1980 | European Pat. Off. |
| 0068939 | 1/1983 | European Pat. Off. |
| 0141512 | 5/1985 | European Pat. Off. |
| 0231856 | 8/1987 | European Pat. Off. |
| 2360145 | 2/1978 | France |
| 57-15217 | 9/1982 | Japan |
| 2181263 | 4/1987 | United Kingdom |

OTHER PUBLICATIONS

Kubota et al., "AN 8'×8' Display Using a Laser ..." SID 83 Digest, May, 1983, pp. 44–45.

Nelson K. F. "Model for a Photo Conductor-Liquid Crystal Image Storage Panel", Photographic Science and Engineering, vol. 20, No. 6, Nov.-Dec. 1976, pp. 268-271.

Primary Examiner—Andrew J. James
Assistant Examiner—Sara W. Crane
Attorney, Agent, or Firm—Kirschstein, Ottinger, Israel & Schiffmiller

[57] ABSTRACT

An updatable optical storage device, which may be in microfiche configuration, includes two electrically conductive layers (2,6) between which a layer (5) of a liquid crystal storage material and a layer (3) of a photoconductive material are sandwiched. In order to record an image on the device, the image is projected on to the photoconductive layer through one of the conductive layers, a voltage is applied between the conductive layers, and the storage material is heated at least over regions where the image is to be stored. Projection of the image is continued until the storage material has cooled. The storage material may, for example, be a liquid crystal polymer or a glassy nematic liquid crystal material. The process can be repeated any number of times to update any part or all of the iamge.

25 Claims, 1 Drawing Sheet

DEVICES AND PROCESS FOR PRODUCING MICROFILM AND MICROFICHE RECORDS

BACKGROUND

1. Field of the Invention

This invention relates to the production of microfilm and microfiche devices, and particularly to the production of microfilm and microfiche records which can be updated. For the sake of simplicity, microfiche devices will be referred to throughout the following description, but it will be apparent that the invention applies equally to the production of microfilm records and other imaging products.

2. Description of Related Art

Microfiches are optical storage media on which very large amounts of data can be stored on a small flexible sheet. For example, a standard A6 size microfiche can store the equivalent of ninety-eight A4 pages of data, arranged in an array of columns and rows. It is quite usual for many copies to be made from a master microfiche, for example where microfiches containing catalogues of books are distributed to libraries.

Such microfiches are usually produced by a photographic process, and because the whole of the photosensitive sheet is developed and fixed in the process, no further data can be subsequently added to the record. It will be apparent, therefore, that if the data requires updating, a new master must be produced and all of the copies must be discarded and new copies made.

A number of updatable microfiches are available. These rely on, for example, electro-photographic processes, or recording on thermoplastic materials, or a combination of dry silver films and thermal processes. Copies of such microfiches are at present made on silver-based photographic sheets or on diazo films, or vesicular copies are made. The copying process may retain the original image polarity or may invert it, depending upon which medium is used for the copies. For example, a positive contrast image will produce a negative copy on a silver-based photographic film. In each case, the copy cannot be altered once it is made, so new copies must be produced each time the master microfiche is updated. The copying process will, in many cases, involve the use of wet chemical processes.

SUMMARY OF THE INVENTION

It is an object of the present invention to provide an updatable optical storage device and a process for producing updatable and/or erasable microfiche masters, and for subsequently producing updatable and/or erasable copies therefrom.

It is a further object of the invention to provide a process for producing such a microfiche master in which all of the data items can be recorded on the microfiche simultaneously, i.e. the microfiche medium is parallel addressed.

According to one aspect of the invention there is provided an updatable optical storage device, comprising first and second electrically conductive layers between which a voltage can be applied; and a layer of a liquid crystal optical storage material and a photoconductive layer disposed between the electrically conductive layers.

According to another aspect of the invention there is provided a process for producing an updatable optical record on a storage device which comprises first and second electrically conductive layers with a layer of a liquid crystal optical storage material and a photoconductive layer disposed therebetween, the process comprising projecting on to the photoconductive layer an image to be stored; applying a voltage between the electrically conductive layers; heating at least those portions of the storage material where the storage image is to be stored; and allowing the storage material to cool while the image is applied.

BRIEF DESCRIPTION OF THE DRAWINGS

Embodiments of the invention will now be described, by way of example, with reference to the accompanying drawing, in which.

DETAILED DESCRIPTION OF THE PREFERRED EMBODIMENTS

Figure 1:
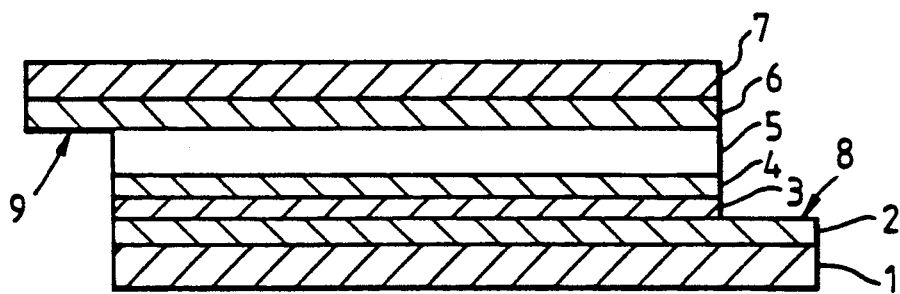
FIG. 1 shows a schematic cross section through a liquid crystal structure for forming a master or duplicate microfiche.

FIG. 1 shows a schematic cross section through a liquid crystal structure which is basically similar to that of known liquid crystal based real-time light valves. The structure comprises a substrate 1 of a flexible optical quality plastics material which is suitable for film-based micrographic technology. The substrate may, for example, be a 100 $\mu$m thick layer of polyester, such as polyethylene terephthalate (PET), or the non-birefringent polyethersulphate (PES). An optically transparent electrode 2 formed of, for example, indium tin oxide (ITO), of say 200-300 Å thickness is sputtered directly on to the plastics substrate or on to a barrier layer (not shown) of, for example, silicon dioxide deposited on the substrate. A photoconductive (PC) layer 3 is deposited over the electrode 2. The PC layer may be of organic or inorganic material. A light-blocking layer 4 is shown in FIG. 1. This layer may be required in some applications, but may otherwise be omitted. If present in the structure, the layer 4 prevents washing-out of the written image during the readout process. The layer may be provided with a dielectric coating (not shown). A layer 5 of a recording medium is contained between the blocking layer 4, if present, or the photoconductive layer 3, if not, and a second electrode 6, similar to the electrode 2. The recording medium comprises a liquid crystal material as will be described later. The layer is, for example, 5-10 $\mu$m thick. The liquid crystal material may contain a pleochroic dye for efficient absorption of the energy from a laser which, in general, will be used for writing such microfiches. A layer 7, similar to the substrate layer 1, is formed over the conductive layer 6. The ends 8, 9 of the layers 1, 2, 6 and 7 project beyond the layers 3, 4 and 5 so that a voltage can readily be applied thereto.

It is known that certain liquid crystal materials exhibit laser-induced optical storage properties. For example, liquid crystal polymers as described in our copending Patent Application No: 8714744 exhibit such properties. The polymers may be of nematic cholesteric or smectic nature or plasticised liquid crystal polymers. Glassy nematic liquid crystal (GNLC) materials, low molar mass smectic A materials with or without nematic mesophases overlying the smectic phase, mixtures of low molar mass storage media such as smectic-cholesteric or cholesteric-nematic materials, microencapsulated smectic liquid crystals in polymeric binders, and smectic or smectic/cholesteric microdroplets dispersed in polymeric binders also exhibit storage properties. Furthermore, certain types of optically non-linear or other electroactive polymers such as liquid crystal copolymers wherein comonomers contain photoisomerisable groups, such as azobenzene moieties, are also suitable for use in the present invention.

The storage properties of the liquid crystal materials used in the microfiche device of the present invention distinguish is from the real-time light valves mentioned above, which normally contain nematic liquid crystal materials and offer little or no permanent storage properties. Such light valves are used for completely different applications, such as for projecting off-the-air television pictures.

Various processes according to the invention using such storage media as listed above will now be described. One mode of operation for duplicating written information from a master fiche of any form involves projecting the master image on to a liquid crystal structure as shown in FIG. 1. This may, in general, be achieved either by transmission through the liquid crystal material or by reflection. The initial condition of the liquid crystal medium will depend upon its generic class.

As a first example, a system which produces optical contrast by the difference between scattering regions and homeotropically aligned liquid crystal regions will be described. In this case, the initial state of the liquid crystal may be an entirely pseudo-homeotropic state produced by heating the material, which may be a smectic material, and then cooling it in the presence of an electric field produced by applying a voltage between the electrodes 2 and 6. The field is removed when the material is cool. Alternatively, the initial state of the microfiche liquid crystal may be of an entirely uniformly scattering nature such as obtained by heating the material to the isotropic state and cooling it without any applied field.

In use of a copy microfiche containing such a material, the master image is projected on to the photoconductive material of the microfiche and a field of a predetermined magnitude is applied across the liquid crystal material. The areas of the photoconductive layer 3 which receive light become conductive, whereas the unexposed areas, i.e. the areas masked by the written information on the master (assuming positive contrast on the master, by way of example) remain non-conductive. Hence, in those areas which are illuminated the applied field will appear almost entirely across the liquid crystal. If the microfiche is heated to take the liquid crystal material to the isotropic state, and the material is allowed to cool, the field in the illuminated areas will cause the liquid crystal molecules to align homeotropically. On the other hand, in the dark areas, where the field is shared between the liquid crystal and photoconductive layers, the field will be, by design, below the switching threshold for the particular liquid crystal material, so that no alignment takes place on cooling. A scattering image is therefore produced which is an exact replica of the master image, and of the same polarity.

It is important in the design of the system that the thicknesses and the dielectric constants of the liquid crystal and photoconductive layers shall be selected so that modulation of the amplitude of the field causes a significant difference between the liquid crystal aligning voltage and the sub-threshold voltage condition.

Figure 2:
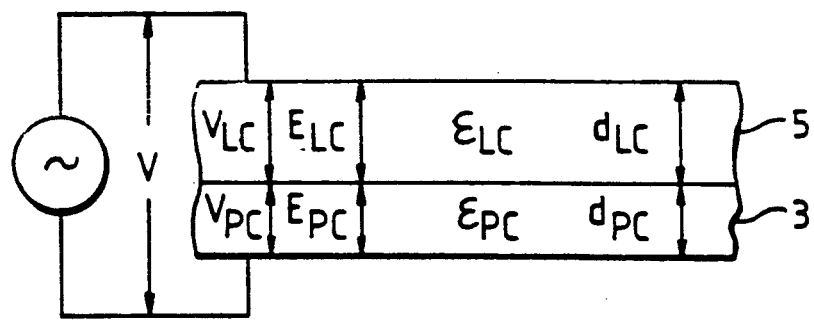
FIG. 2 is a schematic cross section through photoconductive and liquid crystal layers of the structure for explaining the operation of the structure.

This is illustrated with reference to FIG. 2, in which, for the sake of clarity, only the layers 3 and 5 are shown. The following relationships can be derived for the non-conducting state of the photo conductor:

$$\epsilon_{PC} E_{PC} = \epsilon_{LC} E_{LC}$$

$$\therefore \epsilon_{PC} V_{PC}/d_{PC} = \epsilon_{LC} V_{LC}/d_{LC}$$

$$V_{PC} = V - V_{LC}$$

$$\therefore V_{LC} = \frac{\epsilon_{PC}}{\epsilon_{LC}} \cdot \frac{d_{LC}}{d_{PC}} (V - V_{LC}) \quad (1)$$

or $$V_{LC} = \left[ \frac{\frac{\epsilon_{PC}}{\epsilon_{LC}} \cdot \frac{d_{LC}}{d_{PC}}}{1 + \frac{\epsilon_{PC}}{\epsilon_{LC}} \cdot \frac{d_{LC}}{d_{PC}}} \right] V \quad (2)$$

where
V is the applied voltage, and
$\epsilon_{PC}$ and $\epsilon_{LC}$ are the dielectric constants,
$E_{PC}$ and $E_{LC}$ are the portions of the applied field, and
$V_{PC}$ and $V_{LC}$ are the portions of the applied voltage, relative to the photoconductive layer and the liquid crystal layer, respectively.
Ideally, $V_{LC}$ should be as low as possible.

For example, in the case of α-silicon, which is well known as an inorganic photoconductor, $\epsilon_{PC} \approx 1-2$, and for a typical liquid crystal, $\epsilon_{LC} = 10$. For an α-Si layer of 1 μm thickness a mirror-like surface results. This therefore entails operation in the reflective mode. Thinner films are reddish-brown in colour, whereas very thin films appear pink. The thickness of the liquid crystal layer may be 10 μm. Substituting these values in equation (2) above, $V_{LC} \approx \frac{1}{2} V$ so, for example, that approximately half of the voltage is dropped across the liquid crystal and half across the photoconductive layer in the dark areas. In the illuminated areas, substantially all of the voltage is dropped across the liquid crystal. Considering a smectic material disposed in a polymeric binder, or a liquid crystal polymer, the aligning voltage is approximately equal to 60 volts, and 30 volts is insufficient to align the materials. For glassy nematic materials, the aligning voltage is typically 10 volts, and 5 volts will not align the material correctly.

Homogeneous alignment may be the starting condition for the microfiche, for example using a low molar mass smectic liquid crystal as the storage medium.

In carrying out the invention, light and/or heat can be provided in a number of ways, with different results. For example, heat could be applied by subjecting the entire microfiche to a hot air blast. Alternatively, where one or both of the electrode layers 2 and 6 are patterned, heat may be applied by passing a current through the patterns so that the electrode layers are heated. Furthermore, the liquid crystal material might be heated by shining an intense flashlight at the structure in the absence of an electric field. The field would then be synchronised to come on at the instant the flash disappears, and the master image would be simultaneously projected on to the copy microfiche while the liquid crystal cools. Hence, field-enhanced photoconductivity is utilised. Exposure to light in the absence of field in this way has no effect on the alignment state of the liquid crystal, so use of light for heating purposes is practicable. In this mode of operation, the light-blocking layer 4 is not required. Light from the flash is used for the purpose of heating only, and not for read-out. During readout, illumination provided in, for example, an off-axis projection system does not affect the image in the absence of an assisting field.

In the case where intense light is used for readout, and writing and heating are to be effected simultaneously with the readout, the light-blocking layer 4 might be used in most cases. Even then, however, the use of a light-blocking layer could be obviated by operating the structure with particular absorption characteristics of the photoconductive layer 3 and space-charge-limited currents.

Alternatively, the whole copy microfiche could be scanned in a raster-like manner by a laser which is focussed on the liquid crystal material to cause it to melt. This mode is expecially useful in the case where it is desired to produce a copy from the master with only the updated information on it, or where parts of copies are to be voided.

As the liquid crystal microfiche has an inherent selective erase facility, the user of the device can erase lines or individual characters at a later stage so as to edit the copy.

Different liquid crystal storage media require different process conditions. For example, if a low molar mass smectic storage medium, such as a storage material designated S2 which is available from BDH, is used, and the nature of the surfaces containing the liquid crystal material may be such that they create a strong aligning effect, there is a danger that the copying process may not succeed, because the natural aligning effect of the surfaces acts independently of any applied field. This will be true even if the above-mentioned initial uniform scattering condition is used. To avoid this defect, the surfaces can be roughened, or aligning agents which inhibit the homeotropic condition can be used. Alternatively, scattering or contrast-improving dopants can be added to the liquid crystal material to encourage it to scatter rather than align spontaneously. If liquid crystal polymers or encapsulated or dispersed liquid crystals in polymers are used, this problem does not arise.

A mode of operation of a previously proposed cholesteric and smectic side chain polymer recording medium involves writing of scattering information, with a dense texture, on a background in which the scattering is much less but is nevertheless completely unaligned (a so-called "scattering on scattering" storage mechanism). This does not lend itself to a duplicating process because on the master the difference in density of scattering texture is produced by a rapid rate of quenching after laser scanning in the imaged areas, as opposed to the annealed texture in the unrecorded image. In the present duplicating process, the entire microfiche is subjected to the same thermal cycle throughout from the hot air blast or the raster-scanned laser or other heat source. Hence, no distinction between image and background areas can be made when the liquid crystal is subsequently cooled at the same rate throughout, and no electric field effects are involved. It is, therefore, not possible to update the data written on copy microfiches using that mechanism.

A class of materials which is of interest comprises the glassy nematic liquid crystals (GNLC) which are known to have thermo-optic storage applications. However, there is no prior indication as to how the image created on those materials might be reproduced to provide copy microfiches. In a first example of use of such materials the GLNC material is homogeneously aligned by the boundary walls, and information is written by laser in the presence of an electric field. The device is viewed between crossed polarisers. A display having dark characters on a plain or coloured background is thereby obtained. Duplication of a microfiche using such materials is effected in accordance with the present invention by projecting the image from the master on to another GNLC microfiche in which the GNLC material is initially homogeneously aligned. The material is subjected to an electric field and is heated as in the production of the master. Light from the background areas of the master causes enhancement of the field applied to the GNLC (because the photoconductive layer becomes conductive), so that the material aligns homeotropically. The dark areas of the master do not cause enhancement of the field, so the corresponding areas of GNLC remain homogeneously aligned. Hence, when the duplicate microfiche is viewed with the naked eye no informationn is visible, but when the microfiche is viewed between crossed polarisers the image appears with reversed contrast.

In an alternative arrangement using GNLC material, the boundary surfaces may have a layer for producing homogeneous alignment, but the GNLC is aligned initially in a pseudo homeotropic state ready to receive information. The viscosity of the GNLC in the ambient condition ensures that it retains this initial alignment and is not affected by the aligning layers. When the master information is projected on to the copy microfiche and the copy is heated and a field is applied, the viscosity reduces and the GNLC material aligns homogeneously, to produce the same results as in the last-described embodiment.

Using various combinations of additional polarising elements the copy image polarity can be reversed. Alternatively, this can be done at the viewing stage on a suitably modified viewer.

Due to the nature of the microfiche device and its application in the micrographics industry, certain constraints are required in the making of the microfiche. In particular, the type of photoconductor used should be such that its processing temperature is compatible with the permissible substrate temperature. For PES and PET substrates, processing above 230° C. is not recommended. Other optical grade polymers with higher melting temperatures are available, for example poly(e-thyletherketone) (PEEK) which has a melting temperature of 334° C. α-silicon can be deposited as a photoconductor at 200°–300° C., for example, but cannot be deposited practicably at a lower temperature in a plasma-enhanced chemical vapour deposition process. In such a process the layer thickness can be accurately controlled by adjustment of the plasma conditions and the dwell time.

In the case of α-silicon, its optical properties vary with thickness. For thick, (e.g. 1 μm) layers of α-silicon of low dielectric constant a mirror surface results, so that the use of off-axis projection techniques is necessary in imaging and viewing the microfiche.

The ratio of the conductivity of the chosen photoconductor in the imaged regions to its conductivity in the unimaged regions must remain substantially unaffected by temperature, since thermal processing is used in carrying out the invention.

In principle, any inorganic photoconductor, such as α-Si, Se, CdS, ZnSe, ZnS or CdHgTe may be used. Furthermore, organic photoconductive layers are potentially useful, as they offer transmission mode operation characteristics, low processing temperature and simple processing requirements.

The invention provides the facility for parallel addressing with direct size reduction from a document which is to be imaged. Hence, the microfiche can be made directly from a printed document instead of from a laser-generated image. The modulated light pattern obtained from the document is made to impinge on the liquid crystal layer/photoconductive layer structure as described above, after passing through a reducing optical system somewhat in the fashion of a photocopier.

Instead of using a transparent conductive layer as the electrode layer 2, an aluminium layer could be used beneath the photoconductive layer 3.

Advantages and applications of the invention may be summarised as follows.

Liquid crystal storage media can be used to provide updatable microfiche masters and updatable copies from the masters. The masters and copies may be edited by local erasure of data, or the whole record may be erased and the microfiche subsequently reused for mastering or copying.

The microfiche may be parallel addressed, so that all of the information is imaged simultaneously, using a size-reducing optical system.

Updatable/erasable copies may be made from existing updatable masters (e.g. TEP films) or non-updatable masters (e.g. silver-based photographic films or aperture cards) by use of the storage liquid crystal microfiches. Therefore, existing transparent electrophotographic film masters which are sensitive to infrared and to certain environmental conditions, such as high relative humidity, can be copied and replaced by viscous liquid crystal based microfiches, which are much less sensitive to infrared and humidity. Any part of an existing microfiche of any kind may be copied on to a subsequently updatable duplicate microfiche.

In an electronic mail application, information carried by an updatable liquid crystal copy of a liquid crystal master can be remotely amended by digital laser addressing techniques, using data transmitted to remote recording/updating apparatus, for example over a telephone line or from a satellite.

By removing the electrode contact pads after imaging, so that an electric field cannot be subsequently applied to the liquid crystal, an updatable but not selectively erasable microfiche can be provided. This therefore acts as a write once analog optical store, which can form an archive, particularly if high $T_g$ liquid crystal media are used.

It would, of course, be possible to produce, from a fully updated and final liquid crystal based microfiche, a copy on a conventional non-updatable (e.g. photographic) microfiche, if that would be advantageous for special archive stability reasons.

We claim:

1. Apparatus for producing an updatable optical record from a master image, the apparatus comprising an optical storage device having first and second electrically-conductive layers with a layer of a liquid crystal optical storage material and a photoconductive layer disposed therebetween; means to project the image on to the photoconductive layer by passing light through the master image; means to apply a voltage between the electrically-conductive layers; and means to heat at least those portions of the storage material where the image is to be stored and to allow the storage material to cool while the image is projected, the heating means being additional to the projection means and the voltage applying means.

2. Apparatus as claimed in claim 1 wherein the optical storage material comprises a liquid crystal polymer.

3. Apparatus as claimed in claim 1 wherein the optical storage material comprises a glassy nematic liquid crystal material.

4. Apparatus as claimed in claim 1 wherein the optical storage material comprises a low molar mass smectic A material.

5. Apparatus as claimed in claim 1 wherein the optical storage material comprises microencapsulated liquid crystal material in a polymeric binder.

6. Apparatus as claimed in claim 1 wherein the optical storage material comprises a liquid crystal copolymer wherein a comonomer contains a photoisomerizable group.

7. Apparatus as claimed wherein claim 1 in the liquid crystal material contains a pleochroic dye.

8. Apparatus as claimed in claim 1 wherein the optical storage device includes a light blocking layer disposed between the photoconductive layer and the layer of optical storage material.

9. Apparatus as claimed in claim 1 wherein the optical storage device is configuration a microfiche configuration.

10. Apparatus as claimed in claim 1 wherein at least one of the electrically-conductive layers is patterned; and wherein the means to heat the storage material is operative to pass an electric current through the pattern.

11. Apparatus as claimed in claim 1 wherein the means to heat the storage material is operative to scan at least part of the material with a laser beam.

12. Apparatus as claimed in claim 1 wherein the optical storage material is a low molar mass smectic material; and wherein spontaneous alignment of the material in the absence of an applied voltage is inhibited.

13. Apparatus as claimed in claim 1 wherein the projection means includes means to digitise the image to be stored; and wherein the resulting digital signal is used to modulate a laser beam for projecting the image on to the photoconductive layer.

14. A process for producing an updatable optical record on a storage device which comprises first and second electrically-conductive layers with a layer of a liquid crystal optical storage material and a photoconductive layer disposed therebetween, the process comprising the steps of projecting on to the photoconductive layer an image to be stored by passing light through a master image; applying a voltage between the electrically-conductive layers; heating at least those portions of the storage material where the image is to be stored, said heating being effected by an action other than said voltage application and said image projection; and allowing the storage material to cool while the image is applied.

15. A process as claimed in claim 14 wherein at least one of the electrically-conductive layers is patterned; and wherein the storage material is heated by passing an electric current through the pattern.

16. A process as claimed in claim 14 wherein at least part of the optical storage material is heated by scanning it with a laser beam.

17. A process as claimed in claim 14 wherein the optical storage material is a low molar mass smectic material; and wherein spontaneous alignment of the material in the absence of an applied voltage is inhibited.

18. A process as claimed in claim 14 wherein the image to be stored is digitized, and the resulting digital signal is used to modulate a laser beam for projecting the image on to the photoconductive layer.

19. A process as claimed in claim 14 wherein once the image has been stored, at least one of the electrically-conductive layers is structurally altered on to inhibit further application of said voltage thereto.

20. Apparatus for producing an updatable optical record from a master image, the apparatus comprising an optical storage device having first and second electrically-conductive layers with a layer of a liquid crystal optical storage material and a photoconductive layer disposed therebetween; means to project the image on to the photoconductive layer; means to apply a voltage between the electrically-conductive layers; and means to apply to the storage material a current of hot air to heat at least those portions of the storage material where the image is to be stored and to allow the storage material to cool while the image is projected, the heating means being additional to the projection means and the voltage applying means.

21. Apparatus for producing an updatable optical record from a master image, the apparatus comprising an optical storage device having first and second electrically-conductive layers with a layer of a liquid crystal optical storage material and a photoconductive layer disposed therebetween; means to project the image on to the photoconductive layer; means to apply a voltage between the electrically-conductive layers; and means to subject the storage material to a flash of high-intensity light before said voltage is applied, to heat at least those portions of the storage material where the image is to be stored and to allow the storage material to cool while the image is projected, the heating means being additional to the projection means and the voltage applying means.

22. Apparatus for producing an updatable optical record from a master image, the apparatus comprising an optical storage device having first and second electrically-conductive layers with a layer of a liquid crystal optical storage material and a photoconductive layer disposed therebetween; means to project simultaneously the whole of the master image to be stored on to the photoconductive layer; means to apply a voltage between the electrically-conductive layers; and means to heat at least those portions of the storage material where the image is to be stored and to allow the storage material to cool while the image is projected, the heating means being additional to the projection means and the voltage applying means.

23. A process for producing an updatable optical record on a storage device which comprises first and second electrically-conductive layers with a layer of a liquid crystal optical storage material and a photoconductive layer disposed therebetween, the process comprising the steps of projecting on to the photoconductive layer an image to be stored; applying a voltage between the electrically-conductive layers; heating at least those portions of the storage material where the image is to be stored, said heating being effected by a current of hot air; and allowing the storage material to cool while the image is applied.

24. A process for producing an updatable optical record on a storage device which comprises first and second electrically-conductive layers with a layer of a liquid crystal optical storage material and a photoconductive layer disposed therebetween, the process comprising the steps of projecting on to the photoconductive layer an image to be stored; applying a voltage between the electrically-conductive layers; heating at least those portions of the storage material where the image is to be stored, said heating being effected by subjecting the material to a flash of high-intensity light before applying said voltage; and allowing the storage material to cool while the image is applied.

25. A process for producing an updatable optical record on a storage device which comprises first and second electrically-conductive layers with a layer of a liquid crystal optical storage material and a photoconductive layer disposed therebetween, the process comprising the steps of projecting simultaneously the whole of an image to be stored on to the photoconductive layer; applying a voltage between the electrically-conductive layers; heating at least those portions of the storage material where the image is to be stored, said heating being effected by an action other than said voltage application and said image projection; and allowing the storage material to cool while the image is applied.

* * * * *